Figure 1:
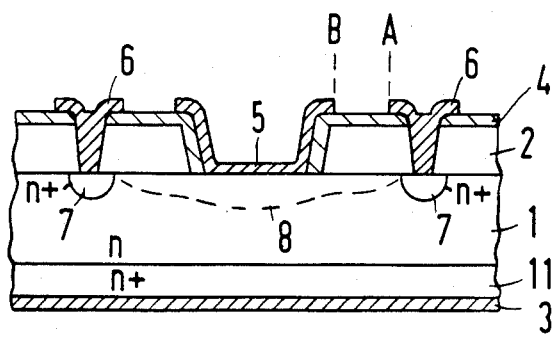

United States Patent [19]

Mitlehner

[11] Patent Number: 4,618,871
[45] Date of Patent: Oct. 21, 1986

[54] SCHOTTKY POWER DIODE

[75] Inventor: Heinz Mitlehner, Munich, Fed. Rep. of Germany

[73] Assignee: Siemens Aktiengesellschaft, Berlin and Munich, Fed. Rep. of Germany

[21] Appl. No.: 494,698

[22] Filed: May 16, 1983

[30] Foreign Application Priority Data

May 25, 1982 [DE]  Fed. Rep. of Germany ....... 3219598

[51] Int. Cl.[4] .................... H01L 29/48; H01L 29/04; H01L 29/06
[52] U.S. Cl. ........................................ 357/15; 357/59; 357/56
[58] Field of Search ...................... 357/15, 22, 59, 53, 357/16, 56, 60

[56] References Cited

U.S. PATENT DOCUMENTS

| | | |
|---|---|---|
| 3,450,958 | 6/1969 | Saxena ................................. 357/60 |
| 3,651,384 | 3/1972 | Waters et al. ........................ 357/53 |
| 3,710,204 | 1/1973 | Batz ..................................... 357/53 |
| 3,763,408 | 10/1973 | Kano et al. ........................... 357/22 |
| 3,890,698 | 6/1975 | Clark ................................... 357/53 |
| 4,009,483 | 2/1977 | Clark ................................... 357/53 |
| 4,157,563 | 6/1979 | Bosselaar ............................ 357/53 |
| 4,212,100 | 7/1980 | Paivinen et al. ...................... 357/59 |
| 4,220,961 | 9/1980 | Werner ................................ 357/59 |

Primary Examiner—Martin H. Edlow
Assistant Examiner—T. M. Henn
Attorney, Agent, or Firm—John F. Moran

[57] ABSTRACT

A Schottky power diode includes a semiconductor substrate, an insulating layer disposed on the substrate, a Schottky contact making contact with the substrate through a window formed in the insulating layer, and a semi-insulating layer disposed on the insulating layer and electrically connected to the Schottky contact for receiving a fixed potential at a lateral distance from the Schottky contact.

8 Claims, 2 Drawing Figures

SCHOTTKY POWER DIODE

The invention relates to a Schottky power diode with a semiconductor substrate, an insulating layer disposed on the substrate, and a metal contact which makes Schottky contact with the substrate through a window formed in the insulating layer.

In Schottky power diodes the rectifying junction is formed by a metal-to-semiconductor contact known as a "Schottky contact". For purposes of definition, the metal contact element, which forms this junction, will hereinafter be termed the "Schottky contact".

The inverse, reverse or blocking voltage of such a Schottky power diode, such as has been described, for instance in the publication "Electronics", Feb. 5, 1976, Vol. 49, No. 3, pages 85 to 89 is determined by the distribution of the field strength in the space charge zone under the Schottky contact, among other factors.

The edge regions under the Schottky contact are particularly critical regions in this case, because, due to the geometry of the Schottky diode, a heavy curvature of the space charge zone can occur. This is accompanied by heavy field strength increases. In addition, it must be taken into account that charges which may exist at the boundary surface between the substrate and the insulating layer, can increase the curvature of the space charge zone.

The increase of the field strength caused by the above-mentioned reasons distinctly reduce the maximum permissible reverse voltage of the Schottky power diode, which depends on the doping of the substrate. To obtain a given reverse voltage, semiconductor material which is doped more weakly would therefore have to be used for the substrate. However, this results in higher forward resistance.

A further problem is posed in a Schottky power diode by the storage effects, leakage currents and instabilities connected with the curvature of the space charge zone at the boundary surface. "Hot" electrons are injected in this case into the insulating layer and remain stuck in place in the boundary surface states. The charge of the boundary layer states is therefore changed in an unstable manner during the operation of the Schottky power diode, which in turn influences the shape of the space charge zone.

It has been attempted to counteract the curvature of the space charge zone by laterally drawing the Schottky contact far beyond the insulating layer. According to other proposals it has been attempted to reduce the curvature of the space charge zone by structuring the substrate surface or by providing additional diffused-in zones. However, these devices still cannot prevent the space charge zone from having a relatively strong curvature under the edge of the Schottky contact.

It is accordingly an object of the invention to provide a Schottky power diode which overcomes the hereinafore-mentioned disadvantages of the heretofore-known devices of this general type, and to do so in such a manner that the space charge zone only has very weak curvature laterally outwardly from the Schottky contact. With the foregoing and other objects in view there is provided, in accordance with the invention, a Schottky power diode, comprising a semiconductor substrate, an insulating layer disposed on the substrate, a Schottky contact making contact with the substrate through a window formed in the insulating layer, and a semi-insulating layer disposed on the insulating layer and electrically connected to the Schottky contact for receiving a fixed potential at a lateral distance from the Schottky contact. In accordance with another feature of the invention, there are provided means for applying a substrate potential to the semiinsulating layer.

In accordance with a further feature of the invention, there is provided another contact disposed in the insulating layer and electrically connected from the semi-insulating layer to the substrate.

In accordance with an additional feature of the invention, the substrate has a given conductivity or conduction type and doping concentration, and including an auxiliary zone embedded in the substrate and connecting the other contact to the substrate, the auxiliary zone having the same given conductivity type but higher doping concentration then the substrate.

In accordance with again another feature of the invention, the semi-insulating layer has a resistivity of $10^5$ to $10^{11}$ ohm cm. In accordance with still a further feature of the invention the substrate has a given band gap, the semi-insulating layer has a portion thereof disposed between the Schottky contact and the substrate, the semi-insulating layer has a density of localized states between $10^{17}$ and $10^{20}$ eV cm$^{-3}$ at least in the portion thereof, and the material of the semi-insulating layer has a band gap which is larger than the given band gap of the substrate at least at the portion thereof.

In accordance with still another feature of the invention, the semi-insulating layer is formed of amorphous silicon and the substrate is formed of monocrystalline silicon.

In accordance with still a further feature of the invention, the semi-insulating layer has a thickness of between 10 and 50 nm at least at the portion thereof.

In accordance with again another feature of the invention, the Schottky contact extends beyond the edge of the window formed in the insulating layer.

In accordance with a concomitant feature of the invention, the other contact extends on to the surface of the semi-insulating layer.

Other features which are considered as characteristic for the invention are set forth in the appended claims.

Although the invention is illustrated and described herein as embodied in a Schottky power diode, it is nevertheless not intended to be limited to the details shown, since various modifications and structural changes may be made therein without departing from the spirit of the invention and within the scope and range of equivalents of the claims.

Figure 2:
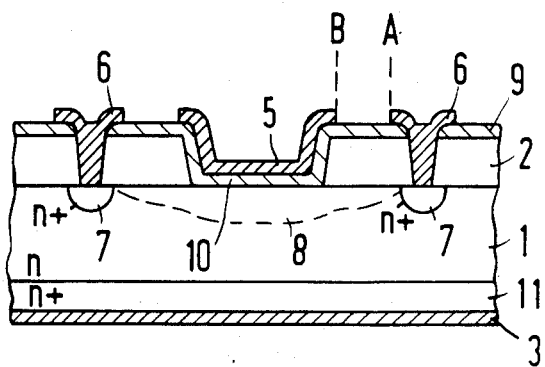

The construction and method of operation of the invention, however, together with additional objects and advantages thereof will be best understood from the following description of specific embodiments when read in connection with the accompanying drawings, in which:

FIG. 1 is a diagrammatic, cross-sectional view of a Schottky power diode according to the invention; and FIG. 2 is a view similar to FIG. 1 of another embodiment of the invention.

Referring now to the figures of the drawing in detail and first particularly to the Schottky power diode according to FIG. 1 thereof, there is seen a substrate 1 which is formed for instance, of n-doped monocrystalline silicon. The resistivity of the substrate depends on the required inverse or reverse voltage. For an inverse or reverse voltage of about 100 V, a resistivity of 20 ohm cm and a thickness of 50 μm are chosen. The substrate is covered on the upper surface thereof with an insulating layer 2 which may be formed of silicon dioxide $SiO_2$. The lower surface is provided with an ohmic contact 3. A semi-insulating layer 4 is disposed on the insulating layer 2. The semi-insulating layer 4 may have a resistivity between $10^5$ and $10^{11}$ ohm cm and typically $10^8$ ohm cm. The insulating layer 2 has a window formed therein in which a Schottky contact 5 is disposed. The Schottky contact 5 is formed of a metal customary for this purpose, such as molybdenum or tungsten, etc. On one hand, the Schottky contact is connected to the substrate 1 and on the other hand, it makes contact with the semi-insulating layer 4. A contact 6 is provided at a lateral distance from the Schottky contact 5. The contact 6 electrically connects the semi-insulating layer 4 to the substrate 1. This is done, for instance, through a heavily n-doped zone 7 embedded in the surface of the substrate.

If a voltage is applied to the Schottky power diode in the inverse, reverse or blocking direction, practically the potential of the substrate prevails at point A of the contact 6. At point B, on the other hand, there is an anode potential. According to the resistance of the semi-insulating layer 4, a small current then flows between point A and B which results in a voltage that increases from the contact 6 toward the Schottky contact 5. This voltge influences a countercharge through the insulating layer 2 at the surface of the substrate which widens the space charge zone 8 in the manner shown. It will be seen that the space charge zone is only gently curved. It is thereby possible to prevent a reverse voltage breakdown caused by the curvature of the space charge zone. In addition, this layer acts as an excellent passivation against external charges. The semi-insulating layer 4 may be formed, for instance, of amorphous or polycrystalline silicon. Other materials, such as amorphous or polycrystalline germanium may also be used. The thickness of the semi-insulating layer 4 may be between 10 and 50 nm. The layer 4 can be vapor deposited in a vacuum, for instance, or deposited by a glow discharge. Methods for vapor deposition and precipitation by a glow discharge are known from the technical literature in the art and will therefore not be given special treatment herein.

The Schottky power diode according to FIG. 2 differs from that according to FIG. 1, by the feature that in the FIG. 2 embodiment a semi-insulating layer 10 is also disposed under the Schottky contact 5. This layer 10 may have the same properties as the semi-insulating layer 9 and may, in particular, be formed of the same material. In any case, the layer 10 must meet the following requirements: The density of localized states in the forbidden band must be between $10^{17}$ and $10^{20}$ eV cm$^{-3}$, its thickness is between 10 and 50 nm and its resistivity is between $10^5$ and $10^{11}$ ohm cm and typically $10^8$ ohm cm. Furthermore, the band gap of the material of the layer 10 must be larger than that of the substrate. If monocrystalline silicon is used for the substrate 1, which has a band gap of 1.1 eV, amorphous silicon with a band gap of 1.6 eV is used for the layer 10.

If an amorphous silicon layer or germanium layer is used, a single uniform layer on the surface of the insulating layer 2 and on the surface of the substrate is then sufficient. The part 10 of the layer lying under the Schottky contact 5 has the effect of causing part of the space charge zone to be built-up at the states in the partial layer 10. The doping of the substrate can thereby be increased (for the same maximum reverse voltage), which causes a reduction of the forward resistance. To improve the path resistance, a highly doped n$^+$-intermediate zone 11 can furthermore be disposed between the substrate 1 and the contact 3.

There has thus been shown and described a novel Schottky power diode which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. In a Schottky power diode, comprising a semiconductor substrate having a given band gap, an insulating layer disposed on said substrate, a first contact making Schottky contact with said substrate through a window formed in said insulating layer, and a semi-insulating layer disposed on said insulating layer and electrically connected to said first contact for receiving a fixed potential at a lateral distance from said first contact, said semi-insulating layer having a resistivity in the range of $10^5$ and $10^{11}$ ohm ·cm; the improvement wherein said semi-insulating layer has a portion thereof disposed between said first contact and said substrate, said portion having a band gap which is larger than said given band gap of said substrate, said Schottky power diode further including a means for applying a substrate potential to said semi-insulating layer.

2. Schottky power diode according to claim 1, wherein said means includes a second contact disposed in said insulating layer and eletrically connects from said semi-insulating layer to said substrate.

3. Schottky power diode according to claim 2, wherein said substrate has a given conductivity type and doping concentration, and including an auxiliary zone embedded in said substrate and connecting said second contact to said substrate, said auxiliary zone having the same given conductivity type but higher doping concentration than said substrate.

4. Schottky power diode according to claim 1, wherein said semiinsulating layer is formed of amorphous silicon and said substrate is formed of monocrystalline silicon.

5. Schottky power diode according to claim 4, wherein said semi-insulating layer has a thickness of between 10 and 50 nm at least at said portion thereof.

6. Schottky power diode according to claim 1, wherein said first contact extends beyond the edge of said window formed in said insulating layer.

7. Schottky power diode according to claim 2, wherein said second contact extends on to the surface of said semi-insulating layer.

8. The Schottky power diode according to claim 1, wherein said portion of said semi-insulating layer has a density of localized states between $10^{17}$ and $10^{20}$ eV cm$^{-3}$.

* * * * *